(12) United States Patent
Depernet et al.

(10) Patent No.: US 9,632,121 B2
(45) Date of Patent: Apr. 25, 2017

(54) ELECTRONIC POWER CONVERTER

(75) Inventors: Daniel Depernet, Valdoie (FR); Oumar Ba, Dakar (SN); Alain Berthon, Valentigney (FR)

(73) Assignees: CENTRE NATIONAL DE RECHERCHE SCIENTIFIQUE, Paris (FR); UNIVERSITE DE FRANCHE-COMTE, Besancon (FR)

(*) Notice: Subject to any disclaimer, the term of this patent is extended or adjusted under 35 U.S.C. 154(b) by 314 days.

(21) Appl. No.: 14/117,006

(22) PCT Filed: May 15, 2012

(86) PCT No.: PCT/EP2012/059020
§ 371 (c)(1),
(2), (4) Date: Nov. 11, 2013

(87) PCT Pub. No.: WO2012/156401
PCT Pub. Date: Nov. 22, 2012

(65) Prior Publication Data
US 2014/0070820 A1    Mar. 13, 2014

(30) Foreign Application Priority Data

May 16, 2011 (FR) .................................. 11 54238

(51) Int. Cl.
*G01R 27/28* (2006.01)
*G01R 27/00* (2006.01)
(Continued)

(52) U.S. Cl.
CPC ......... *G01R 27/00* (2013.01); *G01R 31/3662* (2013.01); *H02M 3/155* (2013.01)

(58) Field of Classification Search
CPC  G01R 31/3624; G01R 31/3662; G01R 27/16; G01R 27/00; H02M 3/155;
(Continued)

(56) References Cited

U.S. PATENT DOCUMENTS 3,535,611 A * 10/1970 Toulemonde ....... H02M 1/4208
                                                                363/8
3,909,621 A *  9/1975 Nollace ................... H02J 9/062
                                                                307/64

(Continued)

FOREIGN PATENT DOCUMENTS

JP    WO 2011004249 A2 *  1/2011 ............... G01K 7/42
WO    WO 2011004249          1/2011

OTHER PUBLICATIONS

E. Moyer, GEOS24705/Solar Photovoltaics, May 2011.*
(Continued)

*Primary Examiner* — Jermele M Hollington
*Assistant Examiner* — Sean Curtis
(74) *Attorney, Agent, or Firm* — Hunton & Williams LLP

(57) ABSTRACT

The present invention relates to electronic power converter suitable, in a first mode, for receiving electrical voltage and/or current magnitudes from a first device as input, for processing them using processing means capable of measuring said electrical magnitudes and servocontrolling said electrical magnitudes based on said measurements and constraints specific to a second device, and for providing the adapted voltage and/or current magnitudes to said second device.

7 Claims, 7 Drawing Sheets

(51) Int. Cl.
*G01R 31/36* (2006.01)
*H02M 3/155* (2006.01)

(58) Field of Classification Search
CPC .. H02M 3/156; H02M 1/10; H02J 3/38; H02J 9/062; H02P 6/002
USPC ....... 324/650, 607; 318/701, 400.21, 400.22, 318/568.22; 363/19, 21.01, 74, 15
See application file for complete search history.

(56) References Cited

U.S. PATENT DOCUMENTS

| | | | | |
|---|---|---|---|---|
| 4,263,653 A * | 4/1981 | Mecklenburg | .......... | G01R 21/01 324/607 |
| 4,499,531 A * | 2/1985 | Bray | .................. | H02M 3/3385 363/19 |
| 4,661,756 A * | 4/1987 | Murphy | .................. | H02P 25/08 310/168 |
| 4,862,057 A * | 8/1989 | Contartese | ............ | H02M 3/156 323/277 |
| 5,010,467 A * | 4/1991 | Tokiwa | ...................... | H02J 3/36 307/58 |
| 5,029,064 A * | 7/1991 | Ball | ...................... | H02M 7/797 307/3 |
| 5,235,282 A * | 8/1993 | Overweg | ............. | G01R 33/421 324/318 |
| 5,262,931 A * | 11/1993 | Vingsbo | .................. | H02M 3/07 323/222 |
| 5,592,368 A * | 1/1997 | Bidaud | ............... | H02M 1/4225 363/34 |
| 5,627,743 A * | 5/1997 | Sadarnac | .............. | H02M 3/337 363/124 |
| 5,910,886 A * | 6/1999 | Coleman | ............. | H02M 3/3376 363/17 |
| 6,282,104 B1 * | 8/2001 | Kern | ...................... | H02M 1/12 363/34 |
| 6,285,568 B1 * | 9/2001 | Taurand | ............ | H02M 3/33569 363/21.14 |
| 6,760,633 B1 * | 7/2004 | Young | ...................... | G05B 5/01 318/561 |
| 6,816,797 B2 * | 11/2004 | Freeman | ................. | G01R 27/02 324/434 |
| 6,914,790 B2 * | 7/2005 | Matsubara | .............. | H02M 5/42 363/34 |
| 7,710,063 B2 * | 5/2010 | Yoshimoto | ............ | H02M 7/483 318/800 |
| 7,764,029 B2 * | 7/2010 | Buente | .................. | F03D 7/0224 318/105 |
| 7,961,484 B2 * | 6/2011 | Lalithambika | .... | H02M 3/33507 363/21.04 |
| 8,411,468 B2 * | 4/2013 | Lalithambika | .......... | H02M 1/08 363/21.02 |
| 8,467,197 B2 * | 6/2013 | Perisic | .............. | H02M 3/33584 323/266 |
| 8,467,208 B1 * | 6/2013 | Johns | .................. | H02M 1/4208 323/207 |
| 8,599,577 B2 * | 12/2013 | Kajouke | ............... | B60L 11/005 363/163 |
| 8,907,612 B2 * | 12/2014 | Linda | .................. | B60L 11/1851 318/722 |
| 2002/0196025 A1 * | 12/2002 | Freeman | ................ | G01R 27/02 324/426 |
| 2004/0135532 A1 * | 7/2004 | Tomatsuri | ............ | G05B 19/404 318/568.22 |
| 2004/0183491 A1 * | 9/2004 | Sidey | .................. | H02M 1/4233 318/400.21 |
| 2007/0035975 A1 * | 2/2007 | Dickerson | ................. | H02J 7/35 363/131 |
| 2007/0103122 A1 * | 5/2007 | Morong | ..................... | G05F 1/46 323/205 |
| 2007/0257681 A1 * | 11/2007 | Christophersen | .. | G01R 31/3651 324/426 |
| 2008/0048662 A1 * | 2/2008 | Hirsch | ............... | G01R 31/3662 324/430 |
| 2009/0040796 A1 * | 2/2009 | Lalithambika | .... | H02M 3/33507 363/21.17 |
| 2010/0091525 A1 * | 4/2010 | Lalithambika | .......... | H02M 1/08 363/21.02 |
| 2010/0110742 A1 * | 5/2010 | West | ........................ | H02H 3/16 363/132 |
| 2010/0164459 A1 * | 7/2010 | Perichon | ................... | H02H 3/08 323/284 |
| 2010/0309692 A1 * | 12/2010 | Chisenga | ................. | H02J 3/383 363/37 |
| 2010/0309696 A1 * | 12/2010 | Guillot | .............. | H02M 3/33507 363/124 |
| 2011/0075454 A1 * | 3/2011 | Jones | ...................... | H02M 1/14 363/67 |
| 2011/0182089 A1 * | 7/2011 | genannt Berghegger | .................. | H02M 3/33507 363/21.13 |
| 2011/0285369 A1 * | 11/2011 | Cuk | ....................... | H02M 3/158 323/282 |
| 2011/0298305 A1 * | 12/2011 | Chisenga | .............. | H02M 3/156 307/151 |
| 2012/0001612 A1 * | 1/2012 | Cuk | ...................... | H02M 3/005 323/311 |
| 2012/0057381 A1 * | 3/2012 | Kimpara | ................. | H02M 3/156 363/78 |
| 2012/0063177 A1 * | 3/2012 | Garrity | .................... | H02J 3/383 363/37 |
| 2012/0081933 A1 * | 4/2012 | Garrity | ............... | H02M 7/4807 363/37 |
| 2012/0081934 A1 * | 4/2012 | Garrity | .................... | H02M 7/46 363/37 |
| 2012/0126628 A1 * | 5/2012 | Bjerknes | ............... | F03D 7/0224 307/84 |
| 2012/0299386 A1 * | 11/2012 | Kaufman | .................. | H02J 1/12 307/82 |
| 2012/0313564 A1 * | 12/2012 | Guitard | ................... | H02M 7/48 318/400.21 |
| 2013/0063983 A1 * | 3/2013 | Sumi | ....................... | H02M 1/40 363/17 |
| 2013/0099800 A1 * | 4/2013 | Francis | .................. | G01R 27/02 324/650 |
| 2014/0111129 A1 * | 4/2014 | Modolo | ............. | B60L 11/1803 318/400.22 |

OTHER PUBLICATIONS

Written Opinion of the ISR PCT/EP2012/059020.*
Texas Instruments, TMS320LF2407, TMS320LF2406, TMS320LF2402 DSP Controllers, Sep. 2003.*
Mauracher et al., "Dynamic Modelling of Lead/Acid Batteries Using Impedance Spectroscopy for Parameter Identification", *Journal of Power Sources*, 67:69-84 (1997).
International Search report, issued Sep. 21, 2012, in International Application No. PCT/EP2012/059020.

* cited by examiner

ELECTRONIC POWER CONVERTER

CROSS-REFERENCE TO RELATED APPLICATIONS

This application is the U.S. National Phase of International Application No. PCT/EP2012/059020, filed May 15, 2012, which claims priority to French Application No. FR 1154238, filed May 16, 2011. The contents of each are hereby incorporated by reference in their entireties.

BACKGROUND OF THE INVENTION

The present invention relates to the field of electrical power sources, such as electrical power storage elements like batteries, supercapacitor modules, fuel cells, etc.

The present invention more specifically relates to the measurement of the impedance of such energy storage sources.

Measuring the impedance of such an electricity source is useful to characterize the state of that source in terms of charge state, operating conditions, degradation state and/or aging state.

Traditionally, this measurement is done using an impedance spectroscope. Such a device is, however, an expensive, bulky device and requires an off-line operating mode, generally in the laboratory, prohibiting the online and real-time characterization of the energy source.

SUMMARY OF THE INVENTION

The present invention relates to an electronic power converter, suitable, in a first mode, for receiving electrical voltage and/or current magnitudes from a first device as input, for processing them using processing means capable of measuring said electrical magnitudes and servocontrolling said electrical magnitudes based on said measurements and constraints specific to a second device, and for providing the adapted voltage and/or current magnitudes to said second device, wherein:

the power converter is suitable for, in a first state of a second mode of the converter, when one of the first and second devices is an electricity source, imposing a direct current having a predetermined value across the terminals of said energy source;

the power converter is further suitable for measuring current and voltage values across the terminals of the energy source during said first state of the second mode, for determining, as a function of said measured current values, a current offset value and, as a function of said measured voltage values, a voltage offset value, said current and voltage offset values being further function of an operating range of the processing means;

the power converter is suitable for exciting, in a second state of the second mode, the energy source by injecting alternating current at least at one fixed excitation frequency, said alternating current being superimposed on the determined imposed direct current;

and wherein the processing means are suitable, in the second state of the second mode, for measuring successive current and voltage values across the terminals of the energy source following the excitation at said excitation frequency, after offsetting said current values, voltage values, respectively, as a function of said determined current offset value, said determined voltage offset value, respectively;

the electronic power converter further including means for determining the impedance of the energy source at the fixed excitation frequency, as a function of the current and voltage values successively measured.

DETAILED DESCRIPTION OF THE INVENTION

Figure 1:
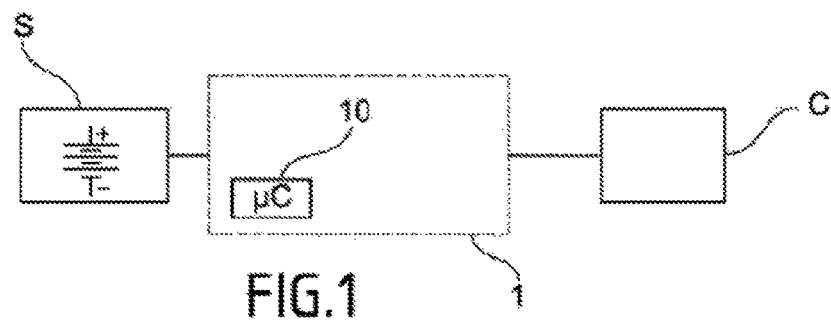
FIG. 1 is a diagrammatic view of a power converter in one embodiment of the invention.

The present invention relates in part to an electronic power converter, suitable, in a first mode, for receiving electrical voltage and/or current magnitudes from a first device as input for processing them using processing means capable of measuring said electrical magnitudes and servocontrolling said electrical magnitudes based on said measurements and constraints specific to a second device, and for providing the adapted voltage and/or current magnitudes to said second device.

According to a first aspect, the invention relates to an electronic power converter of the aforementioned type, characterized in that the power converter is suitable for, in a first state of a second mode of the converter, when one of the first and second devices is an electricity source, imposing a direct current having a predetermined value across the terminals of said energy source;

the power converter is further suitable for measuring current and voltage values across the terminals of the energy source during said first state of the second mode, for determining, as a function of said measured current values, a current offset value and, as a function of said measured voltage values, a voltage offset value, said current and voltage offset values being further function of an operating range of the processing means;

the power converter is suitable for exciting, in a second state of the second mode, the energy source by injecting alternating current at least at one fixed excitation frequency, said alternating current being superimposed on the determined imposed direct current; and wherein the processing means are suitable, in the second state of the second mode, for measuring successive current and voltage values across the terminals of the energy source following the excitation at said excitation frequency, after offsetting said current values, voltage values respectively, as a function of said determined current offset value, said determined voltage offset value, respectively;

the electronic power converter further including means for determining the impedance of the energy source at the fixed excitation frequency, as a function of the current and voltage values successively measured.

The invention therefore makes it possible to take into account the impedance spectroscopy functionality within an electronic power converter suitable for transferring electrical energy.

The invention makes it possible to perform the spectral impedance measurement of the energy source in situ, without adding any equipment and without significantly altering the converter. The invention is in particular especially advantageous in the case of onboard systems, for example in the case of electric or hybrid vehicles, in which cost and bulk are predominant factors. It in fact makes it possible to facilitate the onboard diagnostic of the vehicle batteries and facilitates maintenance at a lower cost.

In various embodiments, the electronic power converter according to the invention further comprises one or more of the following features:

the current offset value, voltage offset value, respectively, is determined such that a voltage, a current, respectively, measured across the terminals of the energy source during the first state of a second mode added to said current offset value, voltage offset value, respectively, is equal to the central point of the operating range of the processing means;

the converter is suitable, in the second state of the second mode, for exciting the energy source by injecting an alternating current superimposed on the direct current of said predetermined value, at several successive fixed excitation frequencies;

the processing means being able to measure successive current and voltage values across the terminals of the energy source following the excitation of each excitation frequency, after offsetting said current values, voltage values, respectively, as a function of said determined current offset value, said determined voltage offset value, respectively; the means for determining the impedance being suitable for determining the impedance of the energy source for each fixed excitation frequency, as a function of the successively measured current and voltage values;

the processing means are able, in the second state of the second mode, to measure successive current and voltage values across the terminals of the energy source following the excitation at said excitation frequency, and after offsetting said current values, voltage values, respectively, and after applying a multiplicative value to said current values, voltage values, respectively, determined as a function of the deviation of said measured values and the operating range of the first means;

the electronic converter includes at least one switch commanded, in the first mode and the second mode, by a square wave corresponding to a given command frequency cyclic ratio, the power converter being suitable, in the first state of the second mode, for varying the value of the cyclic ratio until said determined value of the direct current is obtained across the terminals of said energy source;

the electronic converter includes at least one switch commanded, in the first mode and the second mode, by a square wave at a given command frequency, and the processing means are able, in the second state of the second mode, to measure successive current and voltage values across the terminals of the energy source following the excitation at said excitation frequency, at a sampling frequency equal to the command frequency or a whole sub-multiple of that command frequency;

an excitation frequency is defined by the following relationship:

$$F_{exc} = \frac{F_e}{k \cdot N_{pts\_spect}}$$

where $F_{exc}$ is the excitation frequency, $F_e$ is the sampling frequency, $N_{pts\_spect}$ is the number of points, per period, of the value to be measured at that excitation frequency, $F_{exc}$ and k is integer greater than or equal to 1.

FIG. 1 is a diagrammatic view of a power converter 1 in one embodiment of the invention.

Traditionally, the power converter 1 performs an energy transfer function between the source S (batteries, supercapacitors, fuel cells) and a load C, for example a direct electrical grid, a motor, etc.

When the source S is reversible (for example, batteries and supercapacitors), the energy transfer may be bidirectional. The power converter 1 makes it possible to adapt the input electrical magnitudes, of the voltage and/or current type, to the output electrical magnitudes (direct/direct conversion in the present case).

In a known manner, the converter comprises switches (not shown in FIG. 1) made using semiconductors for example, making it possible to modify the voltage and/or the current while preserving the energy. Using the switches, the voltage and/or the current is cut at a very high frequency (relative to the input or output frequency of the converter), and the obtained result is smoothed to extract the mean value therefrom.

The converter 1 further comprises a microcontroller 10, which controls the converter 1. The microcontroller 10 makes it possible to perform the measurements necessary to subjugate electrical magnitudes to be monitored, to command, in PWM (Pulse Width Modulation), semiconductors of the converter 1, and to ensure the security of the converter.

Figure 2:
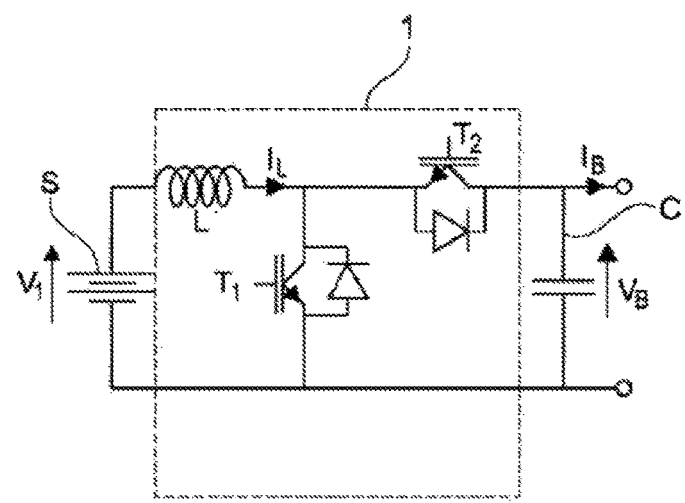
FIG. 2 is a diagram illustrating the energy transfer functionality of the power converter of FIG. 1.

FIG. 2 is an electrical diagram illustrating the energy transfer functionality of a power converter 1 in one embodiment of the invention. In the considered case, the source S is a battery, connected to the load C, corresponding to a direct grid, by means of the power converter 1, here a direct-direct converter of the current reversible step-up type, so as to allow the two-way transfer of energy (charge and discharge of the battery).

Figure 3:
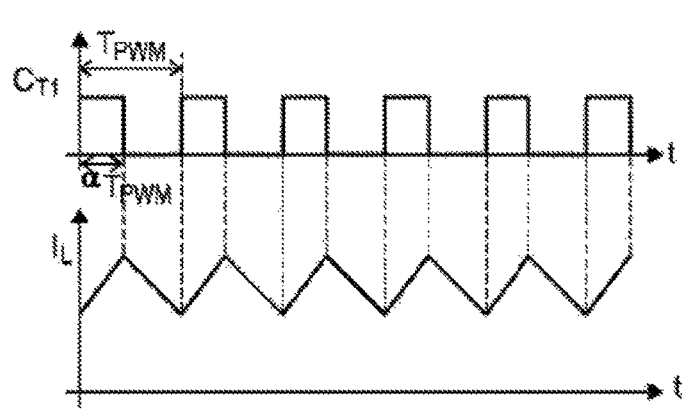
FIG. 3 is a graph showing, as a function of time t, in the top part, a command signal of the switch T1, and in the bottom part, the current $I_L$ obtained as a function of that command signal.

This type of converter 1 is the most representative of the converters used for hybrid vehicle applications due to its voltage step-up function, the direct grid commonly having a voltage higher than that of the batteries. It is made up of a smoothing inductance L and two IGBT transistors $T_1$ and $T_2$ with antiparallel diode. The transistors $T_1$ and $T_2$ are commanded in a complementary manner. The command signal $C_{T1}$ of the switch $T_1$, shown in the top part of FIG. 3, is in the shape of a notch, and has a period $T_{PWM}$. The cyclic ratio of the command signal of $T_1$ is denoted α. The bottom part of FIG. 3 shows the shape of the current $I_L$ in the source S, obtained following the command of the switch $T_1$ shown in the top part of FIG. 3.

The mean values of the currents and voltages of the source and the direct grid C are connected by the relations:

$$\langle V_B \rangle = \frac{\langle V_1 \rangle}{1-\alpha} \quad \langle I_L \rangle = \frac{\langle I_B \rangle}{1-\alpha}$$

where $V_B$ is the voltage across the terminals of the load C, $V_1$ is the voltage across the terminals of the source S, $I_B$ is the current at the load C, $I_L$ is the current in the source S.

The current variations $I_L$ in the period $T_{PWM}$ may be reduced by increasing the value of the inductance of the induction coil L or by increasing the cutting frequency $1/T_{PWM}$.

However, the inductance is increased to the detriment of its cost, weight, and bulk, while increasing the cutting frequency contributes to increasing losses by Joule effect in the semiconductors.

Aside from the energy transfer function, the power converter 1 according to the invention further comprises a functionality for impedance measurement of the source. Thus, relative to the typical functionalities of a power converter, the converter according to the invention implements an impedance spectroscopy functionality using:
  the implementation of complementary monitoring algorithms allowing the frequency electrical excitation of the source;
  the adaptation of the measuring electronics and control thereof by the microcontroller 10 so as to allow the extraction of the magnitudes useful for the frequency impedance measurement;
  the implementation of algorithms for processing the signal in real-time allowing the computation of the impedance spectrum.

In the considered embodiment, the monitoring of the converter 1 allowing energy management (primary function of the converter), the control of the impedance spectroscopy, and the processing of associated signals are done by a single microcontroller 10, for example of the fixed-point 16 bit DSP type, with a CPU frequency of 30 MHz.

The microcontroller 10 used is a TMS320LF2407, dedicated to industrial monitoring applications. The main hardware functionalities integrated into the microcontroller 10 used to implement the invention and the power converter 1 are:
  the PWM (Pulse Width Modulation) or MLI outputs to control the transistors of the power converter 1;
  the analog/digital converter (ADC) and the associated analog inputs for measuring analog magnitudes;
  the SPI (Serial Peripheral Interface) or synchronous serial controller for controlling the measuring electronics (monitoring programmable gains and shifts);
  the SCI (Serial Communication Interface) or RS232 controller for communication with external interfaces (PC, terminal).

Figure 4:
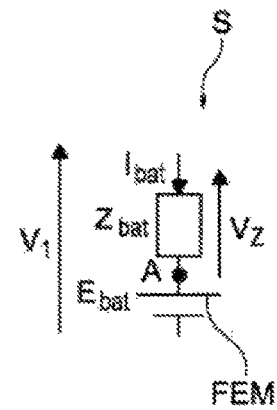
FIG. 4 is a diagrammatic view of the battery S.

As illustrated in FIG. 4, the battery S can be modeled by an electromotive force (EMF) in series with an impedance. This model can also be used in the case of supercapacitors and fuel cells.

The impedance spectroscopy consists of measuring the impedance $Z_{bat}$ of the battery over a frequency range that depends on the phenomena to be observed. The impedance is determined from the measurement of each frequency component of the current spectrum $I_{bat}$ circulating in $Z_{bat}$ and voltage $V_z$ across the terminals of $Z_{bat}$. Each component of the impedance of the frequency f is given by the expression:

$$\underline{Z_{bat}(f)} = \frac{V_Z(f)}{I_{bat}(f)} \text{ (complex notation)}$$

The intermediate point A between the EMF and the impedance being internal to the battery S and therefore physically inaccessible, it is necessary to resolve the following difficulties:
  the voltage across the terminals of $Z_{bat}$ has a very low amplitude relative to the no-load EMF and must be measured with reasonable precision, while $E_{bat}$ and $V_z$ are physically inseparable (the no-load EMF varies from several volts for unitary elements to several hundred volts after association of elements (from 1 to 600 V, for example), the impedance Zbat varies from several mOhms to several hundred mOhms, in general Vz is comprised between 0 and 5% of $E_{bat}$ at most);
  the no-load EMF $E_{bat}$ varies with the charge state of the battery, which makes it difficult to compensate during the measurement of the voltage across the terminals of $Z_{bat}$ (need for adaptable compensation);
  the current frequency component in $Z_{bat}$ must remain of low amplitude relative to the mean current circulating in the battery, while it must be measured with reasonable precision (measurement around operating point) (the mean current depends on the number of associated elements and varies from several amperes to several hundred amperes depending on the application (for example from 1 A to 200 A)); the alternating current must remain low so that the spectroscopy is valid and to avoid deteriorating the source (amplitude will for example remain comprised between 1% and 10% of the nominal current of the source);
  the mean value of the current in the battery may vary depending on the desired charge and discharge level of the battery, which makes it difficult to compensate during the measurement of the current in $Z_{bat}$;
  the switching of the IGBT transistors of the power converter 1 produces strong disruptions on the battery current and voltage in certain frequency ranges, which make it difficult to measure components useful for impedance spectroscopy.

The measuring electronics of the power converter 1 in one embodiment of the invention are therefore produced to perform the following functions:
  measuring the battery current by Hall effect probe (bandwidth −0.5 dB at 100 kHz);
  measuring the voltage $V_1$ in direct engagement without galvanic insulation;
  calibrating the current and voltage by offset compensation and by gains, offsets and gains being programmable by the microcontroller 10 so as to compensate the direct components ($E_{bat}$ and mean current $I_0$) and extract the alternating components useful for the impedance spectroscopy.

Figure 5:
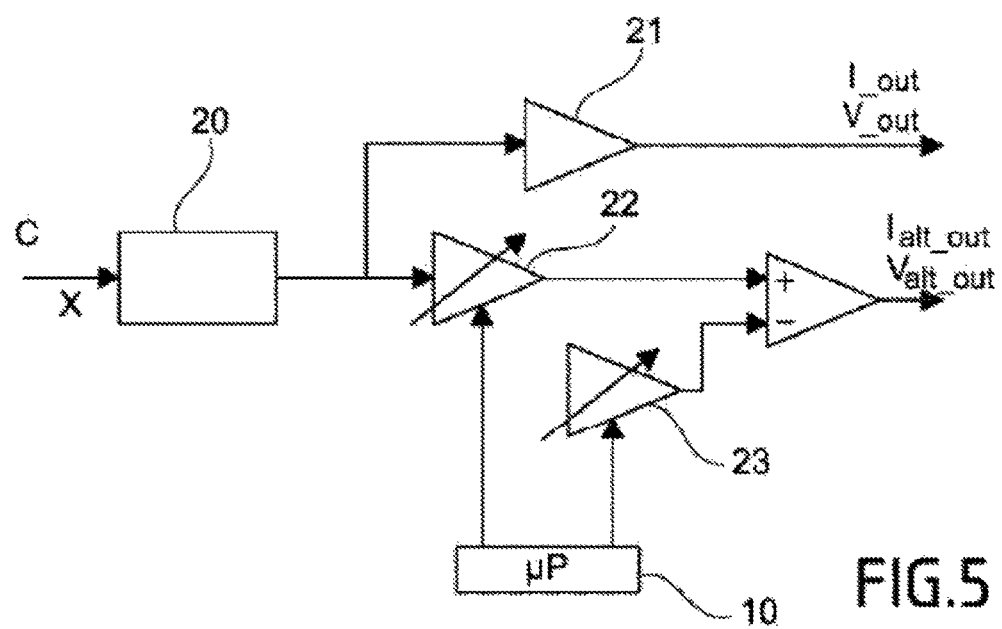
FIG. 5 shows a diagram illustrating the calibration of the measurements by the power converter 1.

FIG. 5 shows a block diagram illustrating the measurements of electrical voltage/current magnitudes relative to the source S by the measuring electronics of the power converter 1, and calibration of those measurements by the power converter 1.

The electrical quantity X ($V_1$, $I_L$) is measured by a measuring sensor 20 (e.g., the Hall effect sensor LTS15NP for the current $I_L$), then a fixed calibration 21 is done on the measured quantity (with a fixed gain value and offset value) and provides an image of the desired quantity (I_out for the current and V_out for the voltage of the battery S). This image is used by the energy transfer functionality. If the impedance spectroscopy functionality is implemented in place of the energy transfer by the power converter 1, a suitable programmable calibration is then done through a multiplication operation 22 by a gain value (to amplify or decrease the measured value) and an offset operation 23 of the multiplied measured value. The image of the desired quantity (Ialt_out for the current and Valt_out for the voltage of the battery S) is then obtained. The gain and offset values are programmed in real-time by the microcontroller 10 in the manner indicated later, via the SPI controller.

Figure 6A:
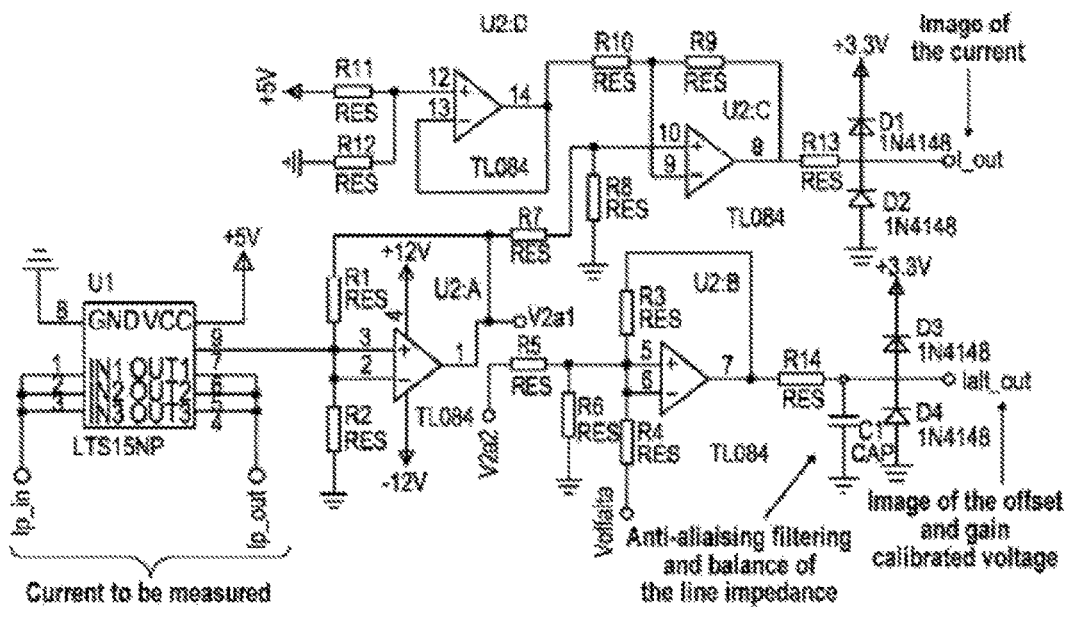
FIG. 6 is a view of the electronic diagram for the measurements and calibrations illustrated in FIG. 5.
Figure 6A:
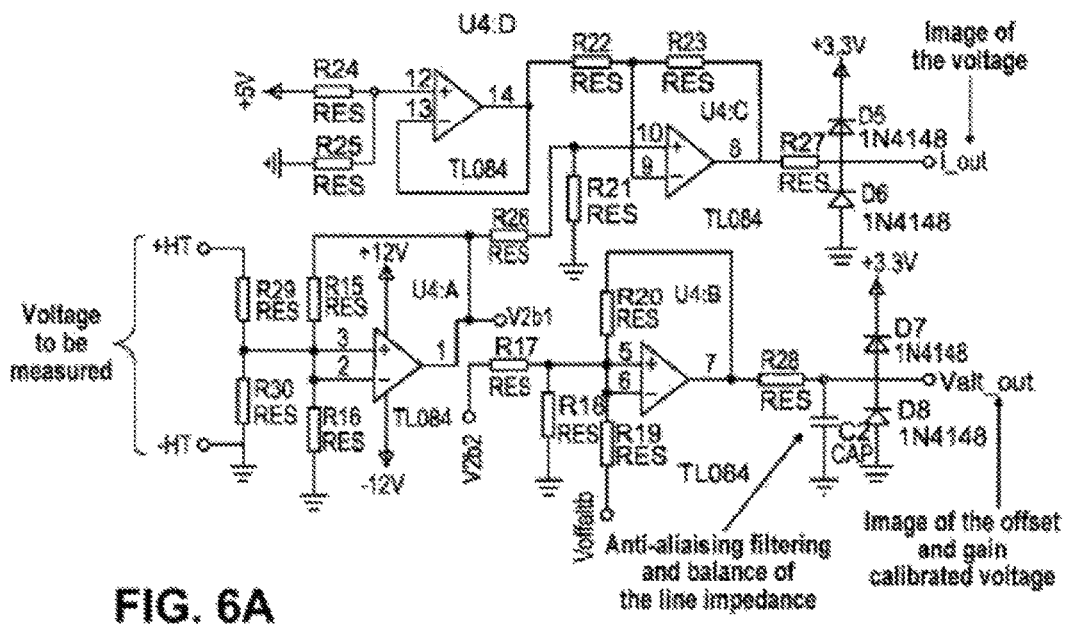
Figure 6B:
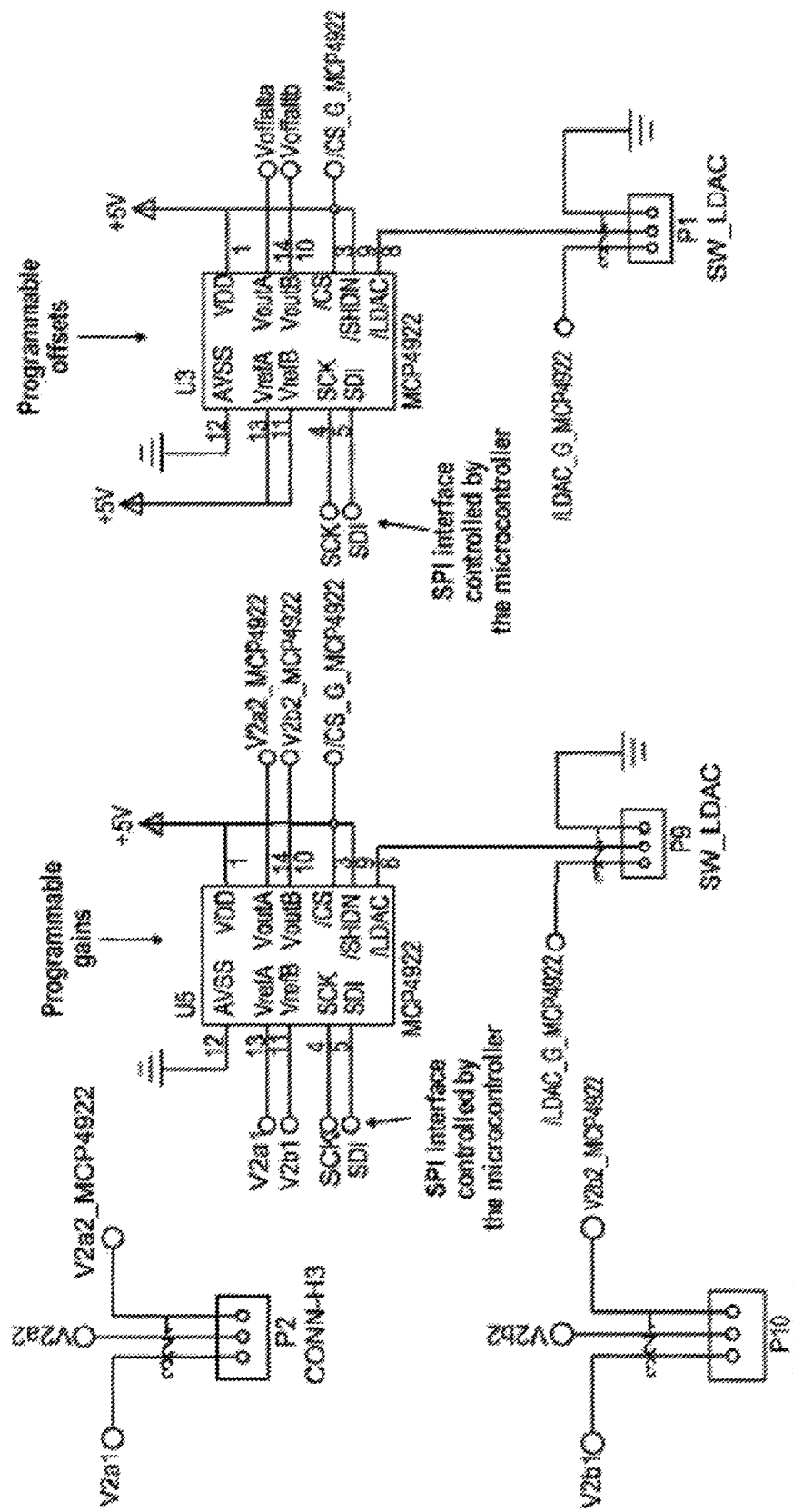

FIG. 6 shows the diagram of the electronic board 12 of the power converter 1 allowing these measurements and calibrations.

The values of the electronic components are defined in order to:
- adjust the initial gains as a function of the application (nominal voltage and current source S, order of magnitude of the impedance to be measured);
- adjust the cutoff frequencies of the anti-aliasing filters;
- balance the line impedances of the measurements of the alternating voltage and current components to avoid introducing a parasitic phase shift between those lines (calibration of the phases, the impedance being characterized by the amplitudes and the phases of the alternating voltage and current components).

These measuring electronics 12 thus make it possible to recover, for the current and voltage of the source S, two analog "images" (or representative values) before digitization by the A/DC, as previously indicated:
- an image resulting from a fixed calibration making it possible to evaluate the absolute size of the current and/or the voltage at the source S (I_out and V_out outputs) in the context of the energy transfer functionality and used for the energy transfer;
- an image resulting from a programmable variable calibration, making it possible to measure only the alternating component of the quantity and used the impedance spectroscopy (Ialt_out and Valt_out outputs).

The calibration is done to adapt the analog voltages in the measuring range of the microcontroller 10. In the considered case, this range is [0; 3.3 V]. The intermediate value of 1.65 V is used as a reference and must correspond to a voltage measured across the terminals of the source equal to 0 V or a current circulating in the source equal to 0 A.

The gains and offsets are adjusted digitally by using digital analog converters (for example, of type MCP4922 with an SPI interface). They are defined as follows:

$$\text{Gain: } G = \frac{D_a}{4096}$$

$$\text{Offset: } V_O = 5 \text{ V} \cdot \frac{D_b}{4096}$$

where $D_a$ and $D_b$ are comprised between 0 and 4095 (precision of 12 bits).

For a measured value X, the corresponding calibrated value will be equal to:

$$G \cdot X - V_0$$

Figure 7:
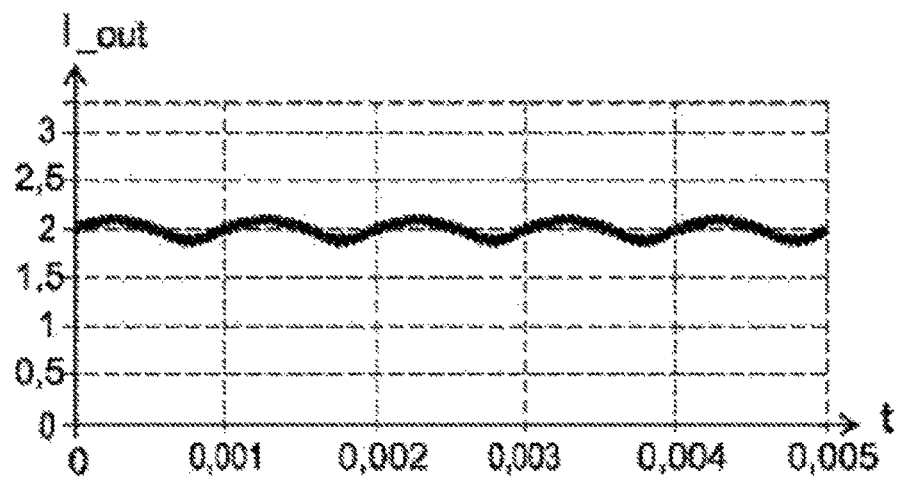
FIG. 7 illustrates the signal obtained at the output I_out as a function of the time, during an impedance measurement by a converter in one embodiment of the invention.
Figure 8:
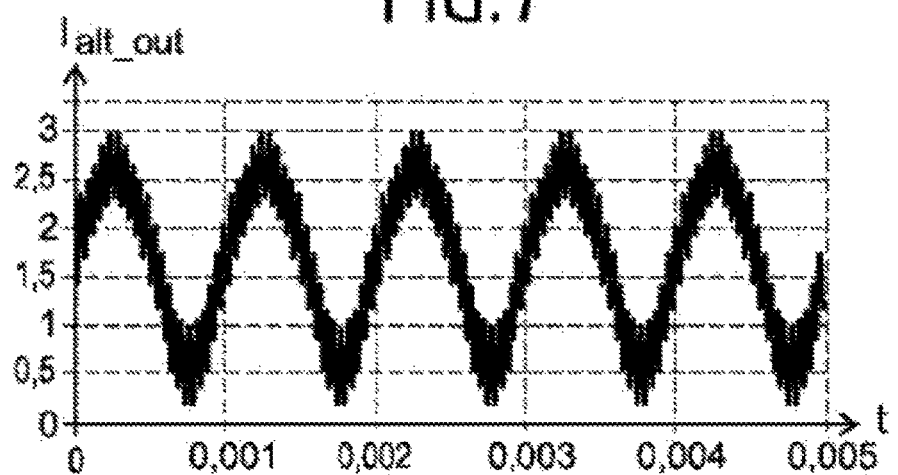
FIG. 8 illustrates the signal obtained at the output Ialt_out as a function of time during an impedance measurement by a converter in one embodiment of the invention.

FIGS. 7, 8, respectively, illustrate the expected result on the two outputs I_out, Ialt_out, respectively, as a function of time (in s) during spectroscopy, showing the direct component of the current (I_out), the alternating excitation (Ialt_out), and the disruptions due to the cutting done by the switches $T_1$, $T_2$ of the converter.

As desired, the alternating component Ialt_out is well centered in the range [0-3.3] and indeed occupies the available range owing to the calibration done.

The impedance spectroscopy process integrated into the power converter 1 as implemented using the microcontroller 10 is described more precisely below.

Phase A: energy transfer, i.e., without spectroscopy:
the normal monitoring algorithms for the energy transfer done in particular by the controller 10 in the power converter 1 are active (charge/discharge of the battery during operation, and optionally upkeep of the charge when idle).

Phase B: when the impedance spectroscopy is to be implemented by the converter 1, before the spectroscopy:
Before carrying out the impedance measurements, the monitoring of the energy transfer is stopped.
The desired operating point of the battery S is adjusted by adjusting the direct current circulating in the battery S. The cyclic ratio $\alpha_0$ of the switch $T_1$ is defined to obtain a current of a desired value $I_0$. (Example: $I_0$=1 A). The impedance spectrum will be defined for that particular operating point.
The offset compensations on the measurements Ialt_out and Valt_out are done continuously during this phase B to allow their calibration. The offsets are computed to keep the value Ialt_out and Valt_out at 1.65 V, i.e., on the intermediate axes corresponding to 0 A and 0 V, respectively, and therefore centered relative to their variation interval.

Phase C: during the impedance spectroscopy
The real-time offset compensations are deactivated; the offsets implemented are those determined at the end of phase B.
The source S is excited by injecting an alternating excitation frequency current $f_i$ superimposed on the current $I_0$ characterizing the operating point. The excitation frequencies $f_i$ making it possible to scan the impedance spectrum are applied successively. The excitation duration of each frequency is defined in number of periods of the signal. This value is configurable.
During the injection, the alternating signals Ialt_out and Valt_out are sampled and digitized after awaiting stabilization, also of a configurable length. The sampling moments are synchronized identically for each acquisition, then sub-sampled as a function of the excitation frequency.
During the measuring of the signals, the impedance is computed according to the following principle:

Computation of the complex expressions of the voltage and current lines at the considered frequency fi by Discrete Fourier Transform (DFT) so as to filter any disruptions on the measurements and residual direct components.

Computing the complex expression of the impedance of the considered frequency fi.

Transferring values from the impedance spectrum toward the interface RS232 of the microcontroller 10.

The monitoring of the energy transfer must be deactivated throughout the entire duration of the measurement of the impedance spectrum and the steady state of the battery S must be kept at a determined value ($I_0$) characterizing the spectroscopy conditions.

The impedance spectrum in fact varies with the current level circulating in the source. To allow error-free characterization of the source, it is therefore necessary to keep the direct current at a known value $I_0$. Each impedance spectrum will therefore be defined for a known current $I_0$.

Additionally, to allow the error-free measurement of the impedance of the source S, it is necessary to avoid any parasitic frequency disruption near or below the considered frequency component. Thus, the monitoring algorithms for the energy transfer must be deactivated to keep the system in steady-state (subjugating the current or voltage of the deactivated direct grid). When the desired operating point, and therefore the current $I_0$, is reached, the cyclic ratio $\alpha_0$ of the command of the converter is frozen so that the impedance spectroscopy is done around the operating point.

In case of transient states on the load, the voltage of the load (i.e., of the direct grid) may move away from its reference value. If priority is given to the stability of the voltage of the direct grid, it will be appropriate, in the event a transient with a high amplitude appears, to end the impedance spectrometry to resume monitoring of the energy transfer by reactivating the subjugations related thereto.

Compliance with this condition is easy to achieve by measuring the voltage of the direct grid.

In the context of the impedance measurement, sampling of the obtained analog signals Ialt_out, Valt_out, done by the A/DC function of the microcontroller 10, must make it possible to obtain a faithful enough digital signal, while avoiding the anti-aliasing phenomenon and without overloading the microcontroller.

The cutting frequency of the converter 1, which is the switching frequency of the switches, called $F_{PWM}=1/T_{PWM}$, defines the adjustment frequency of cyclic ratio and therefore the adjustment limit of the excitation signal used for the spectroscopy.

Thus, the sampling frequency does not need to be greater than $F_{PWM}$.

Figure 9:
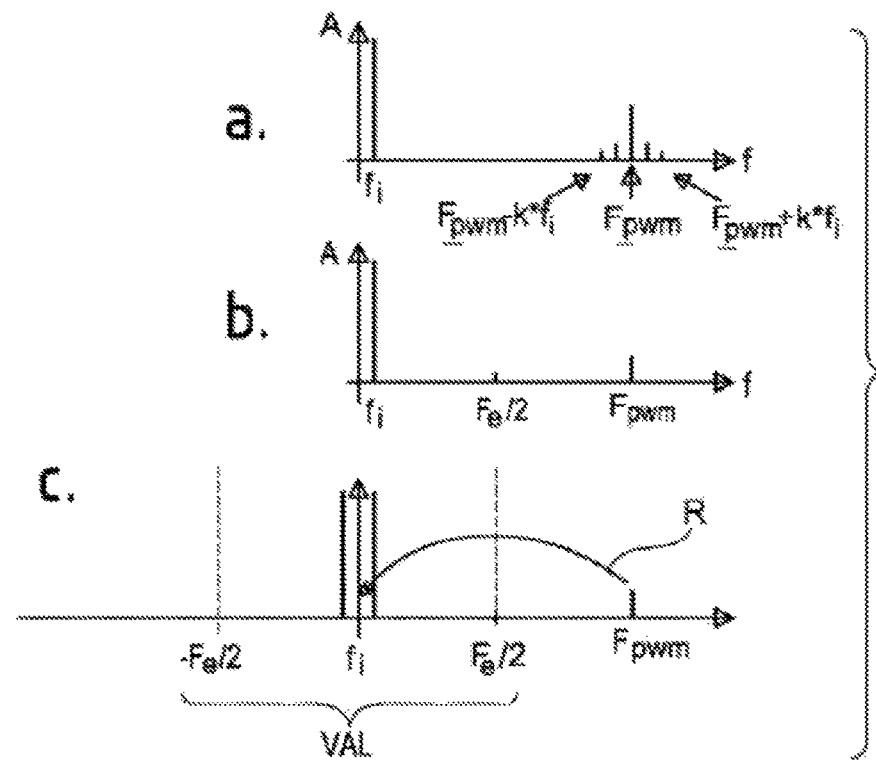
FIG. 9a shows the spectrum of a signal to be measured.
FIG. 9b shows the spectrum of a signal to be measured after partial anti-aliasing filtering.
FIG. 9c shows the spectrum of a signal to be measured after partial anti-aliasing filtering and sampling at the sampling frequency $Fe=F_{PWM}$.

However, the signals to be measured resulting from a pulse width modulation, their spectrum is essentially formed, as shown on the graph of FIG. 9a, comprising the frequencies on the x-axis, and on the y-axis, the amplitude of:
 a main line at the frequency of the program signal $f_i$ (excitation frequency);
 a significant amplitude line at the frequency $F_{PWM}$ that it is difficult to eliminate by anti-aliasing filtering;
 several low-amplitude lines at the frequencies $F_{PWM} \pm n*f_i$.

The problem may be resolved by pushing the sampling frequency back beyond $2*F_{PWM}$ and decimating (or sub-sampling), optionally in a second step, the sampled signal after digital filtering. This strategy has the drawback of considerably increasing the computation load and requiring a more significant, and therefore more expensive, power microcontroller.

The sampling principle used in the considered embodiment makes it possible to reject the harmonics while preserving a low sampling frequency $F_e=F_{PWM}$.

It consists of first performing partial anti-aliasing analog filtering eliminating the low-amplitude harmonics that are not very bothersome with a frequency greater than $F_e/2$. The spectrum of the signal to be measured (Ialt_out or Valt_out) after partial anti-aliasing filtering is shown in FIG. 9b. This filtering functionality is performed by the analog measurement electronics described in reference to FIG. 6.

The sampling is then done synchronously with the switching of the switches $T_1$, $T_2$, which makes it possible to calibrate, on the frequency equal to 0 Hz, the aliasing of the line situated at $F_{PWM}$ such that it does not disrupt the measurement of the excitation lines useful for the impedance spectroscopy ($f_i$). The spectrum of the signal sampled at frequency $F_e=F_{PWM}$ is shown in FIG. 9c. The arrow R indicates the aliasing toward 0 Hz of the line situated at $F_{PWM}$.

Thus, the validity area VAL of the discrete Fourier transform (DFT) limited by the critical Nyquist frequency $F_e/2$ contains only the line at the excitation frequency $f_i$ and a direct component that depends on the sampling moment in the interval $T_e=T_{PWM}$. The lines at the voltage and current frequency $f_i$ can therefore be measured without error by DFT.

Figure 10:
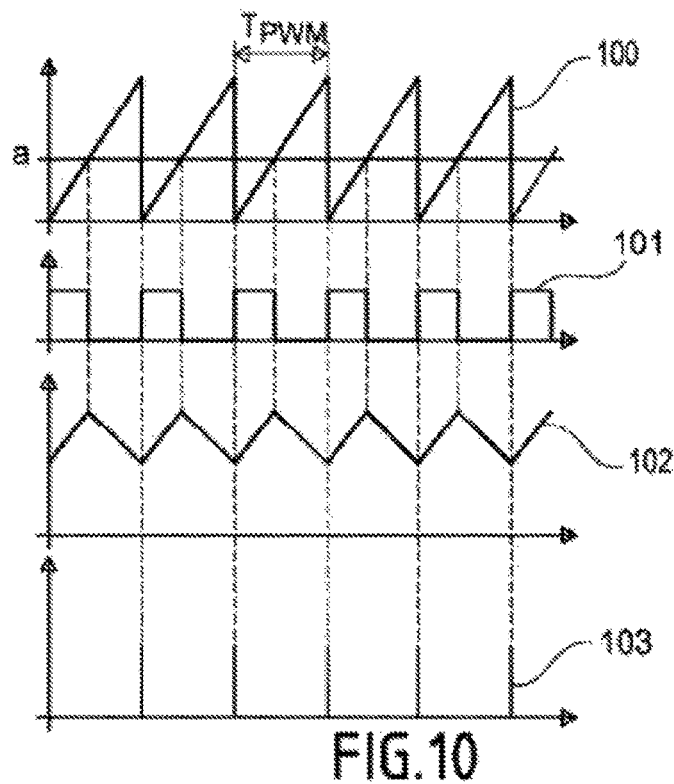
FIG. 10 shows, for a same x-axis showing the time, the evolution of adjustment signals (curve 100), the command signal of the switch $T_1$ (curve 101), the current in the source (curve 102), and the signal sampled at $F_e=F_{PWM}$.

FIG. 10 shows, for a same x-axis showing the time t, the evolution of adjustment signals (curve 100), the command signal of the switch $T_1$ (curve 101), the current in the source S (curve 102), and the signal sampled at $F_e=F_{PWM}$.

In reference to the curve 100, a counter and a comparator are used to adjust $F_{PWM}$ and the cyclic ratio $\alpha$, making it possible to limit the variations of the current as shown in FIG. 102.

The curve 101 shows the command signal switch T1 obtained for the values of the frequency $F_{PWM}$ and the cyclic ratio $\alpha$ of the curve 100.

The curve 102 shows the current in the source resulting from the application of such a command signal.

The curve 103 illustrates the signal sampled at $F_e=F_{PWM}$ in the case of sampling synchronous with the cutting done by the switches.

The obtained signal may be sub-sampled without risk of aliasing, in the case of low-frequency excitation signals that require a low sampling frequency.

In the considered embodiment, a single processor is used to monitor the power converter and for the impedance spectroscopy, which makes it possible to minimize the hardware and software operations.

As indicated above, the integrated spectroscopic algorithm is timed by a sampling frequency $F_e$ equal to the switching frequency of the switches of the converter ($F_{PWM}$). All of the acquisitions are done at that frequency $F_e=F_{PWM}$, then optionally sub-sampled.

In order to allow strict compliance with the excitation frequencies $f_i$, the latter are defined by the following relationship:

$$f_i = \frac{F_e}{k \cdot N_{pts\_spect}}$$

With: $N_{pts\_spect}$: number of points per period of the signal to be measured, and k: integer making it possible to define the frequency of the line (with k≤1).

The product $k \cdot N_{pts\_spect}$ is limited to $2^{16}$ to keep 16-bit encoding of the algorithm (and prevent the increase of the CPU load that would be caused by 32-bit encoding). The observable frequency area in this case is therefore given by:

$$\frac{F_e}{2^{16}-1} \le f_i \le \frac{F_e}{N_{pts\_spect}}$$

For example, with $F_e$=20480 Hz, $N_{pts\_spect}$=20, we have 0.312 Hz≤$f_i$≤1024 Hz.

The algorithms for monitoring the energy transfer being deactivated, the excitation of the source S is done by injecting a current with a constant amplitude with successive frequencies chosen in the considered frequency band, superimposed on the direct current $I_0$ defining the operating point, as described above.

The excitation current is monitored by a proportional corrector (P) ensuring compliance of its amplitude and its frequency. The command of the cyclic ratio dα monitoring the excitation current is superimposed on the value $\alpha_0$ kept constant following the adjustment of the operating point to $I=I_0$.

Figure 11:
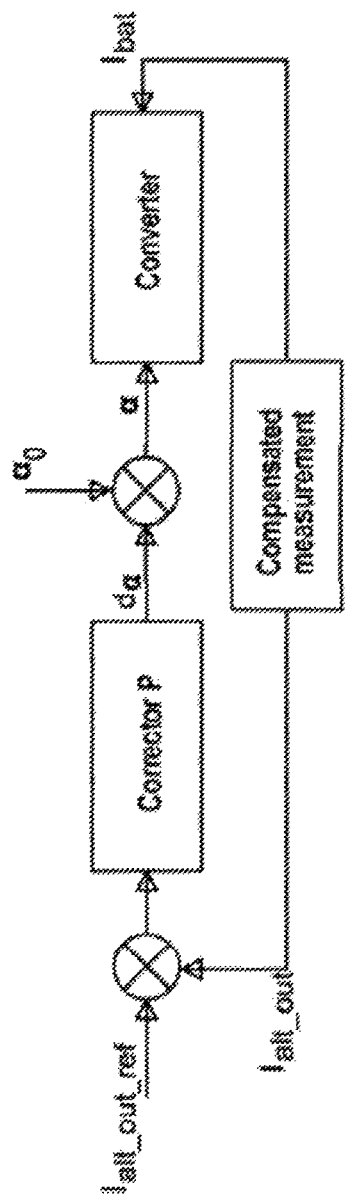
FIG. 11 illustrates the principle of subjugating the excitation current injected in the battery S.

The corresponding subjugation principle is shown in FIG. 11.

The frequency of the superimposed alternating current $I_{alt\_out\_ref}$ is defined by the frequency $f_i$ of the considered frequency line. Its amplitude $I_{max}$ is defined to be relatively low compared to the nominal current $I_0$ of the source (example: $I_{max}$ comprised between 1% and 10% of the nominal current of the source) and remains unchanged irrespective of the line. $I_{alt\_out\_ref}$ is built from a pre-computed table of a sinusoidal signal with angular precision $2\pi/1000$ and amplitude precision $1/500^{th}$.

$$I_{alt\_out\_ref} = I_{max} \cdot \sin(2\pi f_i t)$$

Voltage $V_{alt\_out}$ and current $I_{alt\_out}$ values are measured, for each excitation frequency, by defining the following parameters, by excitation frequency:
the number of measuring periods,
the number of points per period ($N_{pts\_spect}$).

At a constant number of measuring points per period, the sampling frequency of the signals used for the spectroscopy varies as a function of the frequency of the line, and therefore of k:

$$F_{ech\_spect} = \frac{F_e}{k}.$$

Thus, the signals are sampled at $F_e$, then sub-sampled, for the spectroscopy, as a function of the frequency $f_i$ of the considered line.

The number k makes it possible to adjust the sub-sampling as a function of the frequency of the line (so as always to have Npts_spect points per period, even when the frequency of the line changes).

The excitation of the battery before the acquisition during an integer number of period(s) makes it possible to eliminate any potential risk of measuring transient phenomena due to the start-up of the injection or the change of its frequency.

Figure 13:
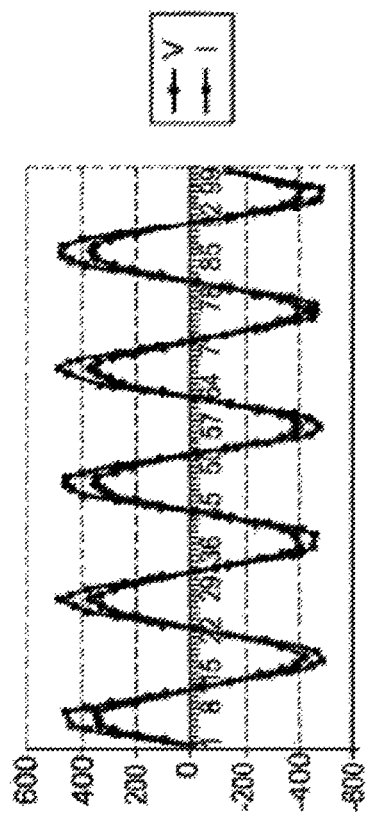
FIG. 13 illustrates the results of measurements of the alternating components of the voltage (V) and the current (I) for an excitation frequency of 0.32 Hz.
Figure 12:
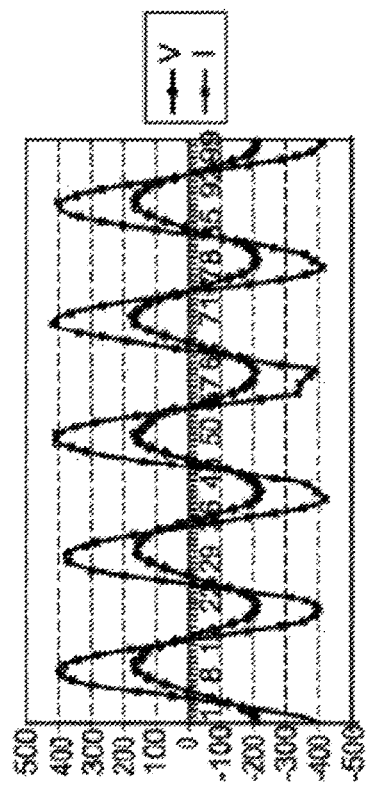
FIG. 12 illustrates the results of measurements of the alternating components of the voltage (V) and the current (I) for an execution frequency of 1024 Hz.

FIG. 12, FIG. 13, respectively, with the sample number on the X axis and the digital result of the analog/digital conversion on the y-axis, illustrates the results of measurements of the voltage (V) and the current (I) obtained at an excitation frequency of 1024 Hz, 0.32 Hz, respectively, for 5 periods and 20 points per period.

Note may in particular be made of the effectiveness of the rejection of the harmonics of the frequency $F_{PWM}$ (the disruptions visible on the curve of FIG. 8 have been deleted on the curves of FIGS. 12 and 13, which are then quasi-sinusoidal).

As indicated above, each current and voltage line is extracted from the measured signal by DFT. The N samples of a signal obtained following excitation at the frequency $f_i$ make it possible to obtain the real and imaginary parts of the harmonic of rank $k_h$ and frequency $f_i$. The rank $k_h$ of the line having the excitation frequency also represents the number of measuring periods (i.e., $N=k_h \cdot N_{pts\_spect}$: the total number of samples equal to the number of samples per period multiplied by the number of periods):

$$\begin{cases} \text{Re}(V_{alt\_out}) = \frac{2}{N}\sum_{n=0}^{N-1} V_{alt\_out}(n) \cdot \cos(2\pi k_h n/N) = \\ \quad \frac{2}{N}\sum_{n=0}^{N-1} V_{alt\_out}(n) \cdot \cos(2\pi n/N_{pts\_spect}) \\ \text{Im}(V_{alt\_out}) = -\frac{2}{N}\sum_{n=0}^{N-1} V_{alt\_out}(n) \cdot \sin(2\pi k_h n/N) = \\ \quad -\frac{2}{N}\sum_{n=0}^{N-1} V_{alt\_out}(n) \cdot \sin(2\pi n/N_{pts\_spect}) \end{cases}$$

$$\begin{cases} \text{Re}(I_{alt\_out}) = \frac{2}{N}\sum_{n=0}^{N-1} I_{alt\_out}(n) \cdot \cos(2\pi k_h n/N) = \\ \quad \frac{2}{N}\sum_{n=0}^{N-1} I_{alt\_out}(n) \cdot \cos(2\pi n/N_{pts\_spect}) \\ \text{Im}(I_{alt\_out}) = -\frac{2}{N}\sum_{n=0}^{N-1} I_{alt\_out}(n) \cdot \sin(2\pi k_h n/N) = \\ \quad -\frac{2}{N}\sum_{n=0}^{N-1} I_{alt\_out}(n) \cdot \sin(2\pi n/N_{pts\_spect}) \end{cases}$$

The impedance is then deduced from the complex expressions of the current and the voltage:

$$\begin{cases} \text{Re}(Z) = \frac{\text{Re}(V_{alt\_out}) \cdot \text{Re}(I_{alt\_out}) + \text{Im}(V_{alt\_out}) \cdot \text{Im}(I_{alt\_out})}{\text{Re}^2(I_{alt\_out}) + \text{Im}^2(I_{alt\_out})} \\ \text{Im}(Z) = \frac{\text{Re}(V_{alt\_out}) \cdot \text{Im}(I_{alt\_out}) - \text{Re}(V_{alt\_out}) \cdot \text{Im}(I_{alt\_out})}{\text{Re}^2(I_{alt\_out}) + \text{Im}^2(I_{alt\_out})} \end{cases}$$

The computation is done for each line of the spectrum. Thus, the excitation of the source successively at different frequencies $f_i$ chosen to scan the desired spectrum width, measuring $I_{alt\_out}$ and $V_{alt\_out}$ then computing the impedance of each of those frequencies, then makes it possible to constitute the impedance spectrum for the considered spectrum width.

The invention may be implemented with microcontrollers including current processors at a low cost in the industrial world.

It allows precise measurement of the impedance values and is very interesting in particular in the case of onboard energy sources, since it makes it possible to perform the measurements in situ.

The invention claimed is:

1. An electronic power converter, the converter being capable of:
   (A) in a first operative mode, transferring energy by, receiving electrical voltage and/or current magnitudes from a first device as input, processing the electrical magnitudes using a processing means capable of measuring the electrical magnitudes and servocontrolling the electrical magnitudes based on the measurements and constraints specific to a second device, and providing the adapted voltage and/or current magnitudes to the second device as output;
   (B) in a first state of a second operative mode, measuring impedance of an energy source (S) between the first and second devices by:
      (i) imposing a direct current having a predetermined value across the terminals of the energy source, and
      (ii) measuring current and voltage values across the terminals of the energy source, and determining, as a function of the measured current values, a current offset value and, as a function of the measured voltage values, a voltage offset value, the current and voltage offset values being further a function of an operating range of the processing means; and
   (C) in a second state of the second operative mode, exciting the energy source by injecting alternating current at least at one fixed excitation frequency, the alternating current being superimposed on the determined imposed direct current;
the processing means being also capable of measuring successive current and voltage values across the terminals of the energy source following the excitation at the excitation frequency, after offsetting the current values and voltage values as a function, respectively, of the determined current offset value and the determined voltage offset value; and
the electronic power converter further comprising a means for determining the impedance of the energy source at the fixed excitation frequency, as a function of the current and voltage values successively measured.

2. The electronic power converter of claim 1, wherein the current offset value and the voltage offset value are determined such that a voltage or a current measured across the terminals of the energy source during the first state of the second mode added, respectively, to the current offset value or voltage offset value is equal to the central point of the operating range of the processing means.

3. The electronic power converter of claim 1, the converter being capable, in the second state of the second mode, of exciting the energy source at several successive fixed excitation frequencies;
   the processing means being capable of measuring successive current and voltage values across the terminals of the energy source following the excitation at each excitation frequency; and
   the means for determining the impedance being capable of determining the impedance of the energy source for each fixed excitation frequency.

4. The electronic power converter of claim 1, wherein the processing means are capable of measuring successive current and voltage values across the terminals of the energy source following the excitation at the excitation frequency, after applying a multiplicative value to the respective current values and voltage values, respectively, determined as a function of the deviation of the measured values and the operating range of the first means.

5. The electronic power converter of claim 1, wherein the converter comprises a switch commanded, in the first mode and in the second mode, by a square wave corresponding to a given command frequency cyclic ratio, the power converter varying, in the first state of the second mode, the value of the cyclic ratio until the determined value of the direct current is obtained across the terminals of the energy source.

6. The electronic power converter of claim 5, wherein the processing means is capable, in the second state of the second mode, of measuring successive current and voltage values, across the terminals of the energy source following the excitation at the excitation frequency, at a sampling frequency equal to the command frequency or a whole sub-multiple of that command frequency.

7. The electronic power converter of claim 1, wherein an excitation frequency is defined by the following relationship:

$$F_{exc} = \frac{F_e}{k \cdot N_{pts\_spect}}$$

wherein $F_{exc}$ is the excitation frequency, $F_e$ is the sampling frequency, $N_{pts\_spect}$ is the number of points, per period, of the value to be measured at the excitation frequency, and k is integer greater than or equal to 1.

* * * * *